United States Patent
Huang et al.

(10) Patent No.: US 10,177,135 B2
(45) Date of Patent: Jan. 8, 2019

(54) INTEGRATED CIRCUIT AND ELECTROSTATIC DISCHARGE PROTECTION CIRCUIT THEREOF

(71) Applicant: VANGUARD INTERNATIONAL SEMICONDUCTOR CORPORATION, Hsinchu (TW)

(72) Inventors: Shao-Chang Huang, Hsinchu (TW); Chun-Chien Tsai, Jhubei (TW); Yeh-Ning Jou, Hsinchu (TW); Geeng-Lih Lin, Jhudong Township, Hsinchu County (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 409 days.

(21) Appl. No.: 15/157,436

(22) Filed: May 18, 2016

(65) Prior Publication Data

US 2017/0338221 A1 Nov. 23, 2017

(51) Int. Cl.
*H02H 9/00* (2006.01)
*H01L 27/02* (2006.01)

(52) U.S. Cl.
CPC ...... *H01L 27/0266* (2013.01); *H01L 27/0285* (2013.01)

(58) Field of Classification Search
CPC .................................................. H01L 27/0266
See application file for complete search history.

(56) References Cited

U.S. PATENT DOCUMENTS

| 5,151,767 | A | * | 9/1992 | Wong | H01L 27/0248 257/355 |
| 6,690,555 | B1 | * | 2/2004 | Pasqualini | H01L 27/0266 361/56 |
| 7,154,721 | B2 | * | 12/2006 | Rho | H01L 27/0266 361/56 |
| 2015/0084702 | A1 | | 3/2015 | Tesch | |

FOREIGN PATENT DOCUMENTS

| TW | I357145 B | 1/2012 |
| TW | 201306231 A1 | 2/2013 |
| TW | 201533880 A | 9/2015 |

\* cited by examiner

*Primary Examiner* — Stephen W Jackson
(74) *Attorney, Agent, or Firm* — Birch, Stewart, Kolasch & Birch, LLP

(57) ABSTRACT

An electrostatic discharge protection circuit is provided. The electrostatic discharge protection circuit includes a first metal-oxide-semiconductor (MOS) transistor, a second MOS transistor, and a third MOS transistor. The first MOS transistor is coupled between a power terminal and a ground terminal. The first MOS transistor has a control electrode terminal coupled to a first node to receive a first signal. The second MOS transistor has a control electrode terminal and a first electrode terminal both coupled to the first node and a second electrode terminal coupled to a bulk of the first MOS transistor. The third MOS transistor has a control electrode terminal coupled to a second node to receive a second node, a first electrode terminal coupled to the first node, and a second electrode terminal coupled to the bulk of the first MOS transistor. The first signal is inverse to the second signal.

20 Claims, 9 Drawing Sheets

INTEGRATED CIRCUIT AND ELECTROSTATIC DISCHARGE PROTECTION CIRCUIT THEREOF

BACKGROUND OF THE INVENTION

Field of the Invention

The invention relates to an integrated circuit, and, more particularly, to an integrated circuit with an electrostatic discharge protection circuit.

Description of the Related Art

In the development of the semiconductor manufacturing process, the dimensions of semiconductor elements have reached the sub-micron level, upgrading the performance and computational speed of integrated circuits. As dimensions shrink, the reliability and capability of electrostatic discharge (ESD) protection of integrated circuits decline significantly. When the dimensions are reduced with the developed manufacture process, the capability of ESD protection is seriously lowered, which causes the ESD tolerance of the elements to become degraded. Thus, an ESD protection circuit is provided to provide a discharge path for electrostatic charges. Particularly, how an ESD protection circuit can quickly provide a discharge path is an important issue.

BRIEF SUMMARY OF THE INVENTION

An exemplary embodiment of an electrostatic discharge protection circuit is provided. The electrostatic discharge protection circuit comprises a first metal-oxide-semiconductor (MOS) transistor, a second MOS transistor, and a third MOS transistor. The first MOS transistor is coupled between a power terminal and a ground terminal. The first MOS transistor has a control electrode terminal coupled to a first node to receive a first signal. The second MOS transistor has a control electrode terminal and a first electrode terminal both coupled to the first node and a second electrode terminal coupled to a bulk of the first MOS transistor. The third MOS transistor has a control electrode terminal coupled to a second node to receive a second node, a first electrode terminal coupled to the first node, and a second electrode terminal coupled to the bulk of the first MOS transistor. The first signal is inverse to the second signal.

An exemplary embodiment of an integrated circuit comprises a core circuit and an electrostatic discharge protection circuit. The core circuit is coupled between a first pad and a second pad. The electrostatic discharge protection circuit is coupled to the first pad. When an electrostatic discharge event occurs at the first pad, the electrostatic discharge protection circuit provides a discharge path between the first pad and the second pad to protect the core circuit. The electrostatic discharge protection circuit comprises a first metal-oxide-semiconductor (MOS) transistor, a second MOS transistor, and a third MOS transistor. The first MOS transistor is coupled between the power terminal and the ground terminal. The first MOS transistor has a control electrode terminal coupled to a first node to receive a first signal. The second MOS transistor has a control electrode terminal and a first electrode terminal both coupled to the first node and a second electrode terminal coupled to a bulk of the first MOS transistor. The third MOS transistor has a control electrode terminal coupled to a second node to receive a second node, a first electrode terminal coupled to the first node, and a second electrode terminal coupled to the bulk of the first MOS transistor. The first signal is inverse to the second signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
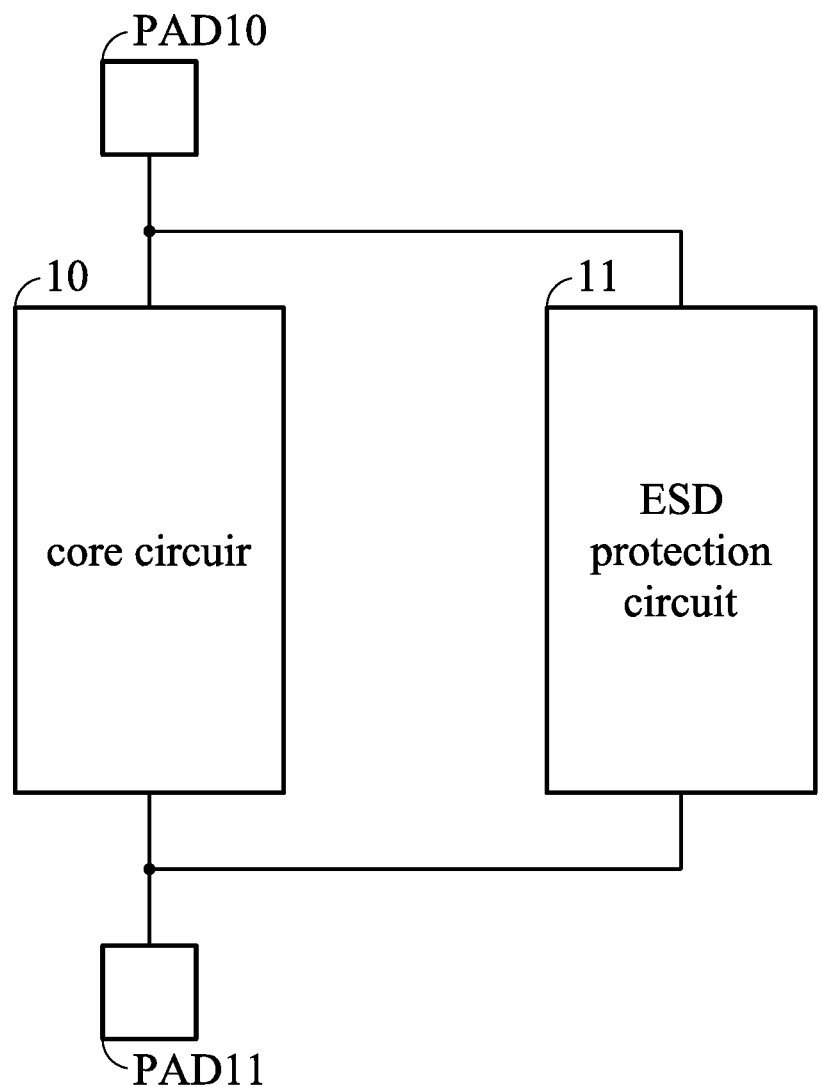
FIG. 1 shows an exemplary embodiment of an integrated circuit.

FIG. 1 shows an exemplary embodiment of an integrated circuit. Referring to FIG. 1, an integrated circuit 1 comprises a core circuit 10 and an electrostatic discharge (ESD) protection circuit 11. The core circuit 10 is coupled to pads PAD10 and PAD11. The PAD11 is coupled to a ground GND. When the core circuit 10 operates in a normal operation mode, an operation voltage VDD is applied to the pad PAD10. When the core circuit 10 does not operate in the normal operation mode, the pad PAD10 does not receive the operation voltage VDD. The ESD protection circuit 11 is coupled between the pads PAD10 and PAD11. During the period when the core circuit 10 does not operate in the normal operation mode, once an ESD event occurs at the pad PAD10, the ESD protection circuit 11 provides a discharge path between the pads PAD10 and PAD11, so that the electrostatic charges (ESD current) at the pad PAD10 are conducted to the pad PAD11 through the discharge path, which prevents the core circuit 10 from being damaged by the electrostatic charges. The various embodiments of the ESD protection circuit 11 will be described in the following.

Figure 2:
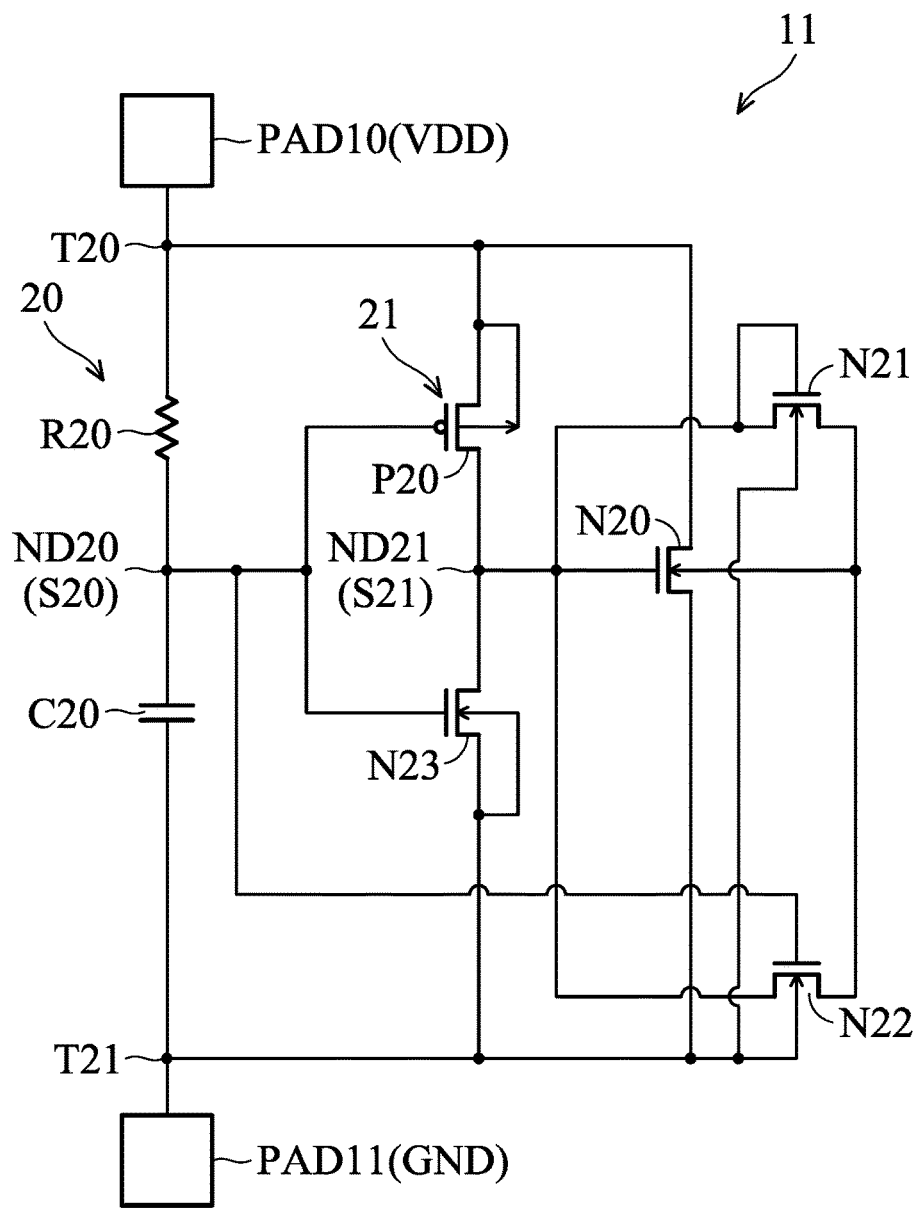
FIG. 2 shows one exemplary embodiment of an electrostatic discharge (ESD) protection circuit with an electrostatic discharge path by using N-type transistors.

FIG. 2 shows an exemplary embodiment of the ESD protection circuit. In order to illustrate the circuit structure of the ESD protection circuit 11, FIG. 2 only shows the ESD protection circuit 11 and the pads PAD10 and PAD11. Referring to FIG. 2, the ESD protection circuit 11 comprises an ESD detection circuit 20, an inverter 21, N-type metal-oxide-semiconductor (NMOS) transistors N20-N22, a power terminal T20, and a ground terminal T21. The power terminal T20 is coupled to the pad PAD10, and the ground terminal T21 is coupled to the pad PAD11. The ESD detection circuit 20 comprises a resistor R20 and a capacitor C20 which are coupled in series. The resistor R20 is coupled between the power terminal T20 and a common node ND20. The capacitor C20 is coupled between the common node ND20 and the ground T21. A signal S20 is generated at the common node ND20. The inverter 21 is coupled to the common node ND20 to receive the signal S20. The inverter 21 inverts the signal S20 to generate a signal S21 at the node ND21. The inverter 21 comprises a P-type metal-oxide-semiconductor (PMOS) transistor P20 and an NMOS transistor N23. The gate (control electrode terminal) of the PMOS transistor P20 is coupled to the common node ND20, the source (electrode terminal) thereof is coupled to the power terminal T20, and the drain (electrode terminal) thereof is coupled to the node ND21. The bulk and the source of the PMOS transistor P20 are coupled together. The gate of the NMOS transistor N23 is coupled to the common node ND20, the drain thereof is coupled to the node ND21, and the source thereof is coupled to the ground terminal T21. The bulk and the source of the NMOS transistor N23 are coupled together. The gate of the NMOS transistor N20 is coupled to the node ND21 to receive the signal S21, the drain thereof is coupled to the power terminal T20, and the source thereof is coupled to the ground terminal T21. The gate and the drain of the NMOS transistor N21 are coupled together at the node ND21, and the source thereof is coupled to the bulk of the NMOS transistor N20. The bulk of the NMOS transistor N21 is coupled to the ground terminal T21. The gate of the NMOS transistor N22 is coupled to the node ND20 to receive the signal S20, the drain thereof is coupled to the node ND21 to receive the signal S21, and the source thereof is coupled to the bulk of the NMOS transistor N20. The bulk of the NMOS transistor N22 is coupled to the ground terminal T21.

When the core circuit 10 operates in the normal operation mode, an operation voltage VDD is applied to the pad PAD10, and the pad PAD11 is coupled to the ground (such as 0 volts (V)). At this time, the signal S20 at the node ND20 is at a high voltage level: that is, there is a high voltage at the node ND20. The inverter 21 inverts the signal S20 with the high voltage level to generate the signal S21 with a low voltage level. In detail, the high voltage at the node ND20 turns off the PMOS transistor P20 and turns on the NMOS transistor N23. Thus, the signal S21 at the node ND21 is at the low voltage level: that is, there is a low voltage (0V) at the node ND21, to turn off the NMOS transistors N20 and N21. Moreover, the high voltage at the node ND20 turns on the NMOS transistor N22. Through the turned-on NMOS transistor N22, the bulk of the NMOS transistor N20 is pulled to 0V. Accordingly, both the gate and the bulk of the NMOS transistor N20 are at 0V. Thus, during the period when the core circuit 10 operates normally, the NMOS transistor N20 can be in a stable turned-off state, so that there is no discharge path between the pads PAD10 and PAD11 in the ESD protection circuit 11, and the operation of the core circuit 10 cannot be affected by any unexpected discharge path in the ESD protection circuit 11.

When the core circuit 10 does not operate in the normal operation mode, the operation voltage VDD is not applied to the pad PAD10. When an ESD event occurs at the pad PAD10, the voltage at the power terminal T20 rises immediately. At this time, based on the element characteristics of the capacitor C20, the signal S20 at the node ND20 is at a lower voltage level (that is, there is a low voltage at the node ND20) to turn off the NMOS transistor N22. The inverter 21 inverts the signal S20 with the low voltage level to generate the signal S21 with a high voltage level. In detail, the low voltage at the node ND20 turns on the PMOS transistor P20 and turns off the NMOS transistor N23. Thus, the signal S21 at the node ND21 is at the high voltage level: that is, there is a high voltage at the node ND21, to turn on the NMOS transistors N20 and N21. Due to the turned-on NMOS transistor N21, there is a voltage difference between the gate and source of the NMOS transistor N21 (the voltage difference is $V_{TH}$, $V_{TH}$ is the threshold voltage of the NMOS transistor N21). As described above, the gates of the NMOS transistors N20 and N21 are coupled together through the node ND21, and the source of the NMOS transistor N21 is coupled to the bulk of the NMOS transistor N20. In other words, the NMOS transistor N21 is coupled between the gate and bulk of the NMOS transistor N20. Thus, there is a voltage difference between the gate and bulk of the NMOS transistor N20, so the gate-bulk voltage $V_{GB}$ is not equal to zero, which ensures that the NMOS transistor N20 is turned on. Due to the turned-on NMOS transistor N20, a discharge path is formed between the power terminal T20 and the ground terminal T21 (that is, between the pads PAD10 and PAD11). Accordingly, the electrostatic charges at the pad PAD10 can be conducted to the pad PAD11 through the discharge path, thereby protecting the elements in the core circuit 10 from being damaged by the electrostatic charges.

Figure 3:
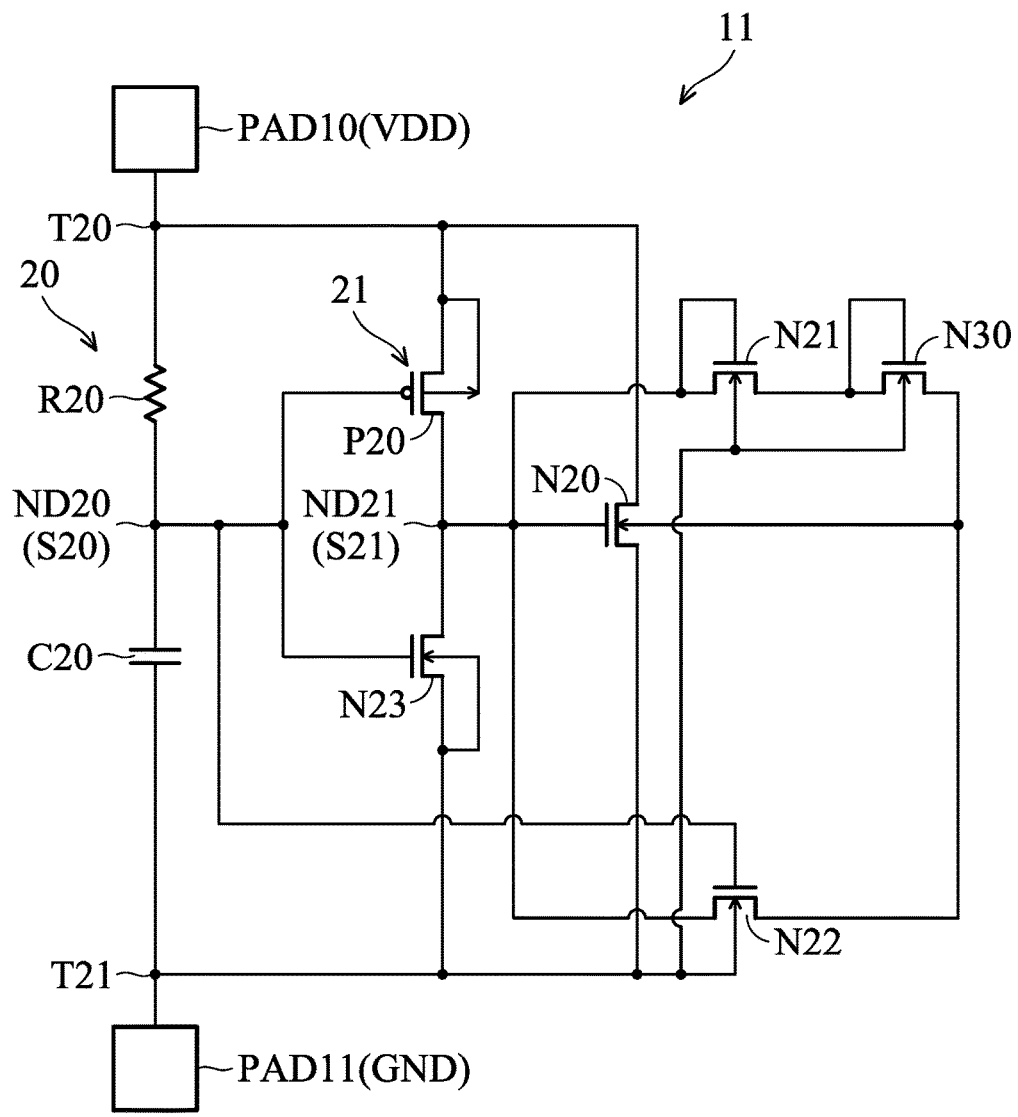
FIG. 3 shows another exemplary embodiment of an ESD protection circuit with an electrostatic discharge path by using N-type transistors.

In an embodiment, the speed of turning on the NMOS transistor N20 can be increased by raising the gate-bulk voltage of the NMOS transistor N20. Thus, the ESD protection circuit 11 may further comprise at least one NMOS transistor which is coupled to the NMOS transistor N21 in series. Referring to FIG. 3, the ESD protection circuit 11 further comprises an NMOS transistor N30. The gate and drain of the NMOS transistor N30 are coupled to the source of the NMOS transistor N21, and the source thereof is coupled to the bulk of the NMOS transistor N20. The bulk of the NMOS transistor N30 is coupled to the ground terminal T21. In the structure of FIG. 3, the source of the NMOS transistor N21 is coupled to the bulk of the NMOS transistor N20 through the NMOS transistor N30. In FIGS. 2 and 3, the elements with the same reference signs perform the same operation, thus, the related operations are omitted. In the embodiment, when the core circuit 10 does not operate in the normal operation mode and an ESD event occurs at the pad PAD10, both the NMOS transistors N21 and N30 are turned on. At this time, the voltage difference between the gate of the NMOS transistor N21 and the source of the NMOS transistor N30 is two times the value of $V_{TH}$. As described above, the gates of the NMOS transistors N20 and N21 are coupled together through the node ND21, and the source of the NMOS transistor N30 is coupled to the bulk of the NMOS transistor N20. In other words, there are two NMOS transistors N21 and N30 coupled between the gate and bulk of the NMOS transistor N20. Thus, the gate-bulk voltage $V_{GB}$ (=$2V_{TH}$) of the NMOS transistor N20 in FIG. 3 is larger than the gate-bulk voltage $V_{GB}$ (=$V_{TH}$) of the NMOS transistor N20 in FIG. 2. Compared with the embodiment of FIG. 2, the NMOS transistor N20 in FIG. 3 can be turned on more quickly when an ESD event occurs at the pad PAD10: that is, the NMOS transistor N20 in FIG. 3 can provide a discharge path in a short time.

In the embodiment of FIG. 3, one NMOS transistor which is coupled to the NMOS transistor N21 in series is given as an example for illustration. However, in other embodiments, the number of NMOS transistors coupled to the NMOS transistor N21 in series can be determined according to the system requirements. The higher the number of NMOS transistors coupled to the NMOS transistor N21 in series is, the more the gate-bulk voltage $V_{GB}$ of the NMOS transistor N20 is, so that the NMOS transistor N20 can be turned on more quickly when an ESD event occurs at the pad PAD10.

Figure 4:
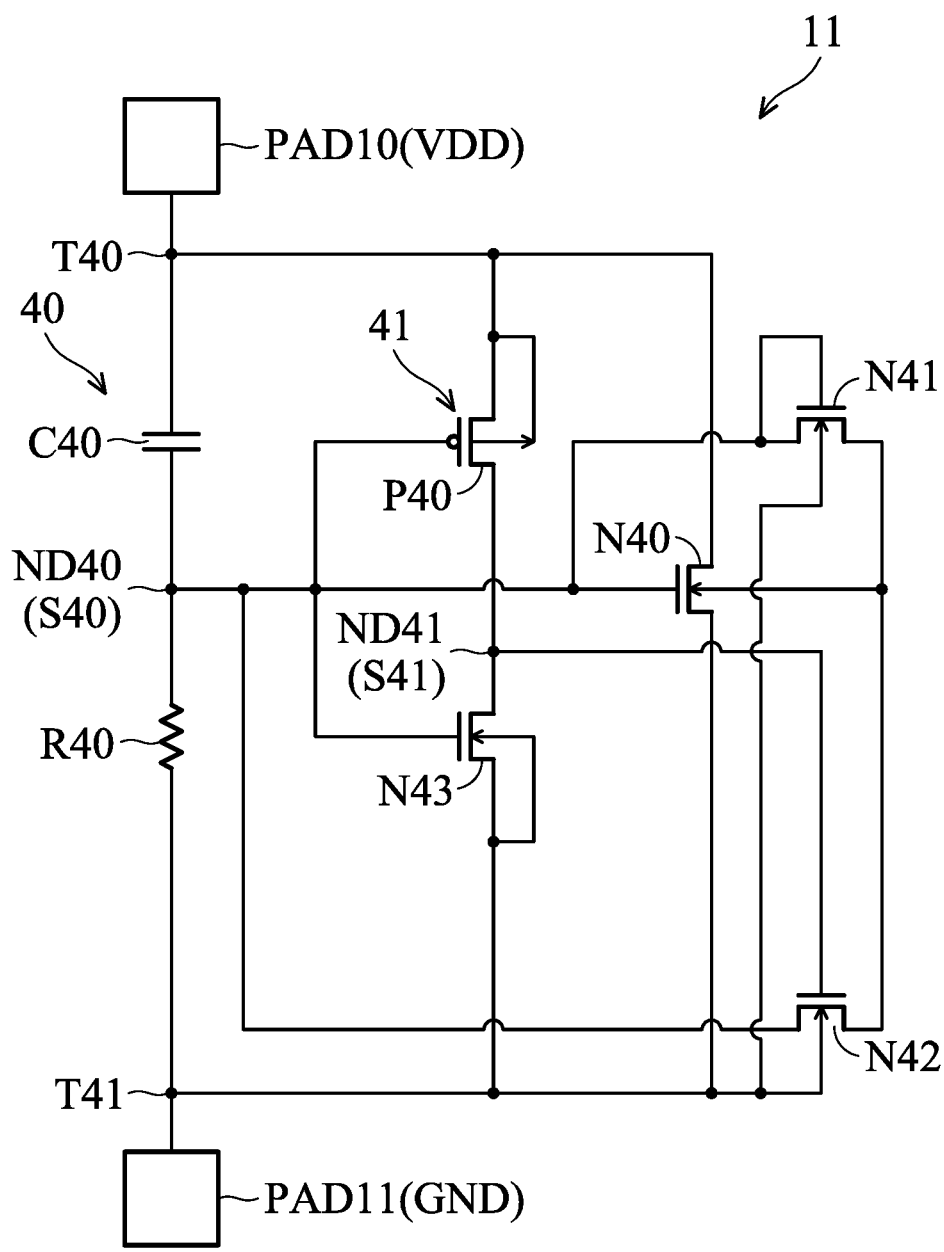
FIG. 4 shows another exemplary embodiment of an ESD protection circuit with an electrostatic discharge path by using N-type transistors.

FIG. 4 shows another exemplary embodiment of the ESD protection circuit. In order to illustrate the circuit structure of the ESD protection circuit 11, FIG. 4 only shows the ESD protection circuit 11 and the pads PAD10 and PAD11. Referring to FIG. 4, the ESD protection circuit 11 comprises an ESD detection circuit 40, an inverter 41, NMOS transistors N40-N42, a power terminal T40, and a ground terminal T41. The power terminal T40 is coupled to the pad PAD10, and the ground terminal T41 is coupled to the pad PAD11. The ESD detection circuit 40 comprises a resistor R40 and a capacitor C40 which are coupled in series. The capacitor C40 is coupled between the power terminal T40 and a common node ND40. The resistor R40 is coupled between the common node ND40 and the ground terminal T41. A signal S40 is generated at the common node ND40. The inverter 41 is coupled to the common node ND40 to receive the signal S40. The inverter 41 inverts the signal S40 to generate a signal S41 at the node ND41. The inverter 41 comprises a PMOS transistor P40 and an NMOS transistor N43. The gate (control electrode terminal) of the PMOS transistor P40 is coupled to the common node ND40, the source (electrode terminal) thereof is coupled to the power terminal T40, and the drain (electrode terminal) thereof is coupled to the node ND41. The bulk and the source of the PMOS transistor P40 are coupled together. The gate of the NMOS transistor N43 is coupled to the common node ND40, the drain thereof is coupled to the node ND41, and the source thereof is coupled to the ground terminal T41. The bulk and the source of the NMOS transistor N43 are coupled together. The gate of the NMOS transistor N40 is coupled to the node ND40 to receive the signal S40, the drain thereof is coupled to the power terminal T40, and the source thereof is coupled to the ground terminal T41. The gate and the drain of the NMOS transistor N41 are coupled together at the node ND40, and the source thereof is coupled to the bulk of the NMOS transistor N40. The bulk of the NMOS transistor N41 is coupled to the ground terminal T41. The gate of the NMOS transistor N42 is coupled to the node ND41 to receive the signal S41, the drain thereof is coupled to the node ND40 to receive the signal S40, and the source thereof is coupled to the bulk of the NMOS transistor N40. The bulk of the NMOS transistor N42 is coupled to the ground terminal T41.

When the core circuit 10 operates in the normal operation mode, an operation voltage VDD is applied to the pad PAD10, and the pad PAD11 is coupled to the ground (such as 0V). At this time, the signal S40 at the node ND40 is at a low voltage level: that is, there is a low voltage at the node ND40, to turn off the NMOS transistors N40 and N41. The inverter 41 inverts the signal S40 with the low voltage level to generate the signal S41 with a high voltage level. In detail, the low voltage at the node N40 turns off the NMOS transistor N43 and turns on the PMOS transistor P40. Thus, the signal S41 at the node ND41 is at the high voltage level: that is, there is a high voltage at the node ND41, to turn on the NMOS transistor N42. Through the turned-on NMOS transistor N42, the bulk of the NMOS transistor N40 is pulled to the low level voltage. Accordingly, both the gate and the bulk of the NMOS transistor N40 are at 0V. Thus, during the period when the core circuit 10 operates normally, the NMOS transistor N40 can be in a stable turned-off state, so that there is no leakage current path between the pads PAD10 and PAD11 in the ESD protection circuit 11, and the operation of the core circuit 10 cannot be affected by any unexpected discharge path in the ESD protection circuit 11.

When the core circuit 10 does not operate in the normal operation mode, the operation voltage VDD is not applied to the pad PAD10. When an ESD event occurs at the pad PAD10, the voltage at the power terminal T40 rises immediately. At this time, based on the element characteristics of the capacitor C40, the signal S40 at the node ND40 is at a high voltage level (that is, there is a high voltage at the node ND40) to turn on the NMOS transistors N40 and N41. The inverter 41 inverts the signal S40 with the high voltage level to generate the signal S41 with a low voltage level. In detail, the high voltage at the node ND40 turns off the PMOS transistor P40 and turns on the NMOS transistor N43. Thus, the signal S41 at the node ND41 is at the low voltage level: that is, there is a low voltage at the node ND41, to turn off the NMOS transistor N42. Due to the turned-on NMOS transistor N41, there is a voltage difference between the gate and source of the NMOS transistor N41 (the voltage difference is $V_{TH}$, $V_{TH}$ is the threshold voltage of the NMOS transistor N41). As described above, the gates of the NMOS transistors N40 and N41 are coupled together through the node ND40, and the source of the NMOS transistor N41 is coupled to the bulk of the NMOS transistor N40. In other words, the NMOS transistor N41 is coupled between the gate and bulk of the NMOS transistor N40. Thus, there is a voltage difference between the gate and bulk of the NMOS transistor N40, so the gate-bulk voltage $V_{GB}$ is not equal to zero, which ensures that the NMOS transistor N40 is turned on. Due to the turned-on NMOS transistor N40, a discharge path is formed between the power terminal T40 and the ground terminal T41 (that is, between the pads PAD10 and PAD11). Accordingly, the electrostatic charges at the pad PAD10 can be conducted to the pad PAD11 through the discharge path, thereby protecting the elements in the core circuit 10 from being damaged by the electrostatic charges.

Figure 5:
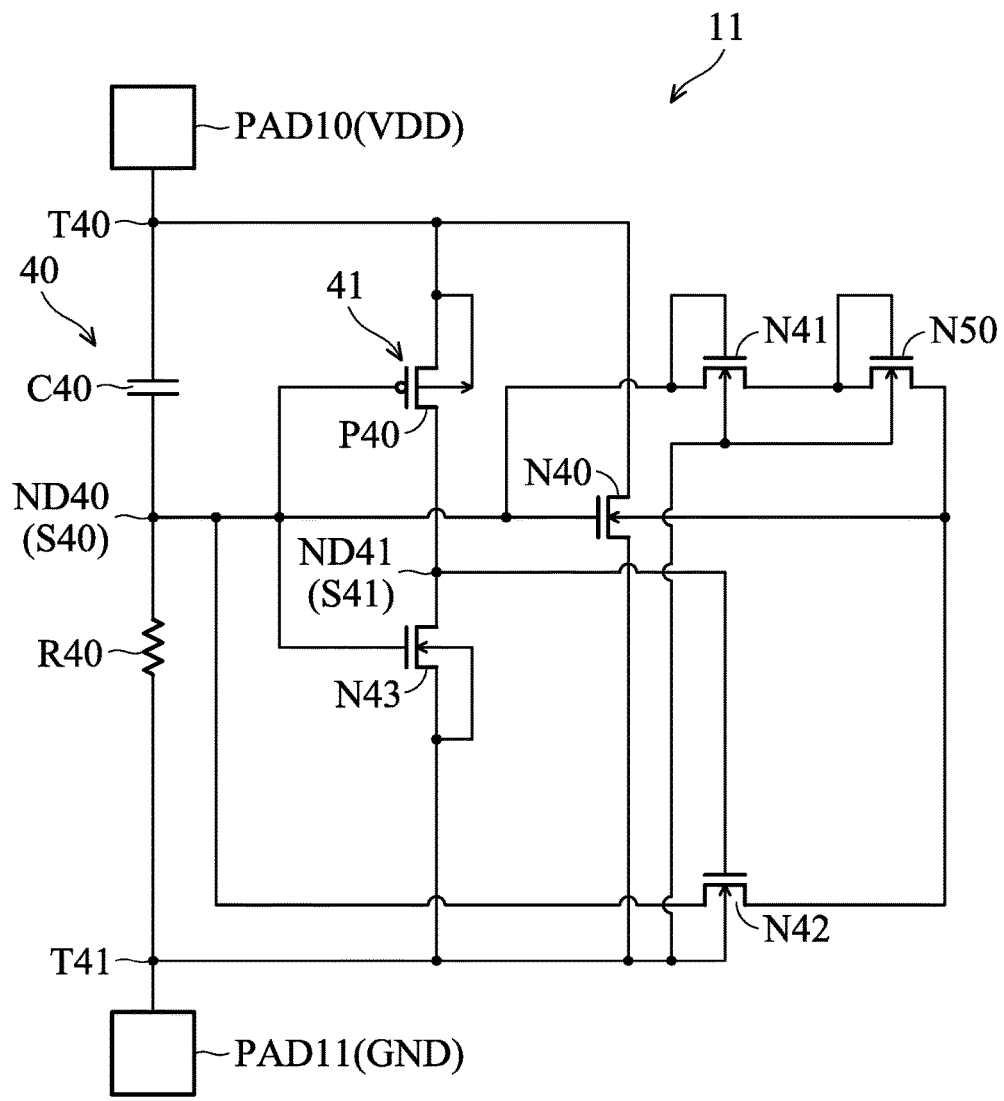
FIG. 5 shows another exemplary embodiment of an ESD protection circuit with an electrostatic discharge path by using N-type transistors.

In an embodiment, the speed of turning on the NMOS transistor N40 can be increased by raising the gate-bulk voltage of the NMOS transistor N40. Thus, the ESD protection circuit 11 may further comprise at least one NMOS transistor which is coupled to the NMOS transistor N41 in series. Referring to FIG. 5, the ESD protection circuit 11 further comprises an NMOS transistor N50. The gate and drain of the NMOS transistor N50 are coupled to the source of the NMOS transistor N41, and the source thereof is coupled to the bulk of the NMOS transistor N40. The bulk of the NMOS transistor N50 is coupled to the ground terminal T41. In the structure of FIG. 5, the source of the NMOS transistor N41 is coupled to the bulk of the NMOS transistor N40 through the NMOS transistor N50. In FIGS. 4 and 5, the elements with the same reference signs perform the same operation, thus, the related operations are omitted. In the embodiment, when the core circuit 10 does not operate in the normal operation mode and an ESD event occurs at the pad PAD10, both the NMOS transistors N41 and N50 are turned on. At this time, the gate-bulk voltage $V_{GB}$ of the NMOS transistor N40 in FIG. 5 is two times the value of $V_{TH}$, which is larger than the gate-bulk voltage $V_{GB}$ (=$V_{TH}$) of the NMOS transistor N40 in FIG. 4. Compared with the embodiment of FIG. 4, the NMOS transistor N40 in FIG. 5 can be turned on more quickly when an ESD event occurs at the pad PAD10: that is, the NMOS transistor N40 in FIG. 5 can provide a discharge path in a short time.

In the embodiment of FIG. 5, one NMOS transistor which is coupled to the NMOS transistor N41 in series is given as an example for illustration. However, in other embodiments, the number of NMOS transistors coupled to the NMOS transistor N41 in series can be determined according to the system requirements. The higher the number of NMOS transistors coupled to the NMOS transistor N41 in series is, the more the gate-bulk voltage $V_{GB}$ of the NMOS transistor N40 is, so that the NMOS transistor N40 can be turned on more quickly when an ESD event occurs at the pad PAD10.

Figure 6:
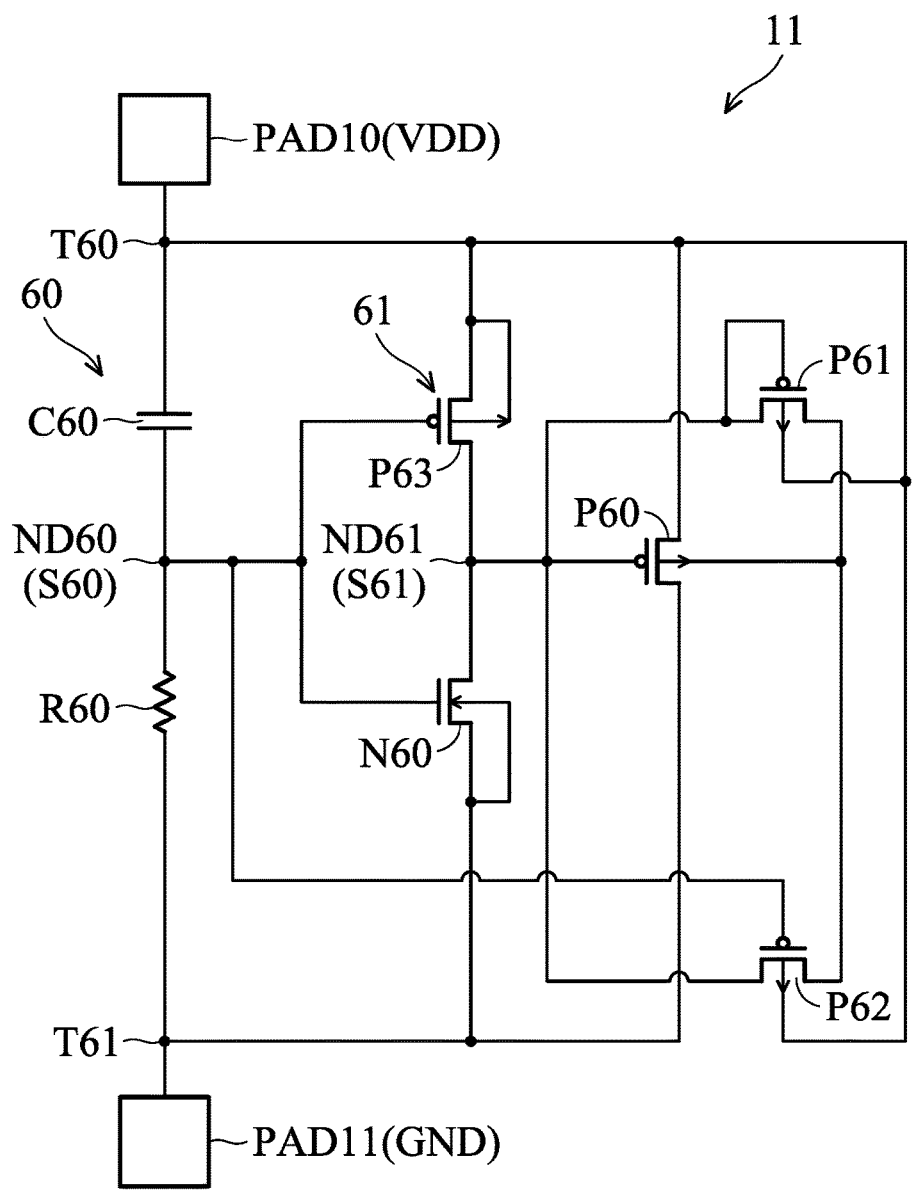
FIG. 6 shows one exemplary embodiment of an ESD protection circuit with an electrostatic discharge path by using P-type transistors.

In the above embodiments, the transistors which provide the discharge paths are implemented by NMOS transistors. In other embodiments, PMOS transistors can be used to provide discharge paths. FIG. 6 shows another exemplary embodiment of the ESD protection circuit. Referring to FIG. 6, the ESD protection circuit 11 comprises an ESD detection circuit 60, an inverter 61, PMOS transistors P60-P62, a power terminal T60, and a ground terminal T61. The power terminal T60 is coupled to the pad PAD10, and the ground terminal T61 is coupled to the pad PAD11. The ESD detection circuit 60 comprises a resistor R60 and a capacitor C60 which are coupled in series. The capacitor C60 is coupled between the power terminal T60 and a common node ND60. The resistor R60 is coupled between the common node ND60 and the ground T61. A signal S60 is generated at the common node ND60. The inverter 61 is coupled to the common node ND60 to receive the signal S60. The inverter 61 inverts the signal S60 to generate a signal S61 at the node ND61. The inverter 61 comprises a PMOS transistor P63 and an NMOS transistor N60. The gate (control electrode terminal) of the PMOS transistor P63 is coupled to the common node ND60, the source electrode terminal thereof is coupled to the power terminal T60, and the drain (electrode terminal) thereof is coupled to the node ND61. The bulk and the source of the PMOS transistor P63 are coupled together. The gate of the NMOS transistor N60 is coupled to the common node ND60, the drain thereof is coupled to the node ND61, and the source thereof is coupled to the ground terminal T61. The bulk and the source of the NMOS transistor N60 are coupled together. The gate of the PMOS transistor P60 is coupled to the node ND61 to receive the signal S61, the source thereof is coupled to the power terminal T60, and the drain thereof is coupled to the ground terminal T61. The gate and the source of the PMOS transistor P61 are coupled together at the node ND61, and the drain thereof is coupled to the bulk of the PMOS transistor P60. The bulk of the PMOS transistor P61 is coupled to the power terminal T60. The gate of the PMOS transistor P62 is coupled to the node ND60 to receive the signal S60, the source thereof is coupled to the node ND61 to receive the signal S61, and the drain thereof is coupled to the bulk of the PMOS transistor P60. The bulk of the PMOS transistor P62 is coupled to the power terminal T60.

When the core circuit 10 operates in the normal operation mode, an operation voltage VDD is applied to the pad PAD10, and the pad PAD11 is coupled to the ground (such as 0V). At this time, the signal S60 at the node ND60 is at a low voltage level: that is, there is a low voltage at the node ND60. The inverter 61 inverts the signal S60 with the low voltage level to generate the signal S61 with a high voltage level. In detail, the low voltage at the node ND60 turns off the NMOS transistor N60 and turns on the PMOS transistor P63. Thus, the signal S61 at the node ND61 is at the high voltage level: that is, there is a high voltage at the node ND61, to turn off the PMOS transistors P60 and P61.

Moreover, the low voltage at the node ND60 turns on the PMOS transistor P62. Through the turned-on PMOS transistor P62, the bulk of the PMOS transistor P60 is pulled to the high level of the node ND61. Accordingly, both the gate and the bulk of the PMOS transistor P60 are at the same high voltage level. Thus, during the period when the core circuit 10 operates normally, the PMOS transistor P60 can be in a stable turned-off state, so that there is no discharge path between the pads PAD10 and PAD11 in the ESD protection circuit 11, and the operation of the core circuit 10 cannot be affected by any unexpected discharge path in the ESD protection circuit 11.

When the core circuit 10 does not operate in the normal operation mode, the operation voltage VDD is not applied to the pad PAD10. When an ESD event occurs at the pad PAD10, the voltage at the power terminal T60 rises immediately. At this time, based on the element characteristics of the capacitor C60, the signal S60 at the node ND60 is at a high voltage level (that is, there is a high voltage at the node ND60) to turn off the PMOS transistor P62. The inverter 61 inverts the signal S60 with the high voltage level to generate the signal S61 with a low voltage level. In detail, the high voltage at the node ND60 turns off the PMOS transistor P63 and turns on the NMOS transistor N60. Thus, the signal S61 at the node ND61 is at the low voltage level: that is, there is a low voltage (0V) at the node ND61, to turn on the PMOS transistors P60 and P61. Due to the turned-on PMOS transistor P61, there is a voltage difference between the gate and drain of the PMOS transistor P61 (the voltage difference is $V_{TH}$, $V_{TH}$ is the threshold voltage of the PMOS transistor P61). As described above, the gates of the PMOS transistors P60 and P61 are coupled together through the node ND61, and the drain of the PMOS transistor P61 is coupled to the bulk of the PMOS transistor P60. In other words, the PMOS transistor P61 is coupled between the gate and bulk of the PMOS transistor P60. Thus, there is a voltage difference between the gate and bulk of the PMOS transistor P60, so the gate-bulk voltage $V_{GB}$ is not equal to zero, which ensures that the PMOS transistor P60 is turned on. Due to the turned-on PMOS transistor P60, a discharge path is formed between the power terminal T60 and the ground terminal T61 (that is, between the pads PAD10 and PAD11). Accordingly, the electrostatic charges at the pad PAD10 can be conducted to the pad PAD11 through the discharge path, thereby protecting the elements in the core circuit 10 from being damaged by the electrostatic charges.

Figure 7:
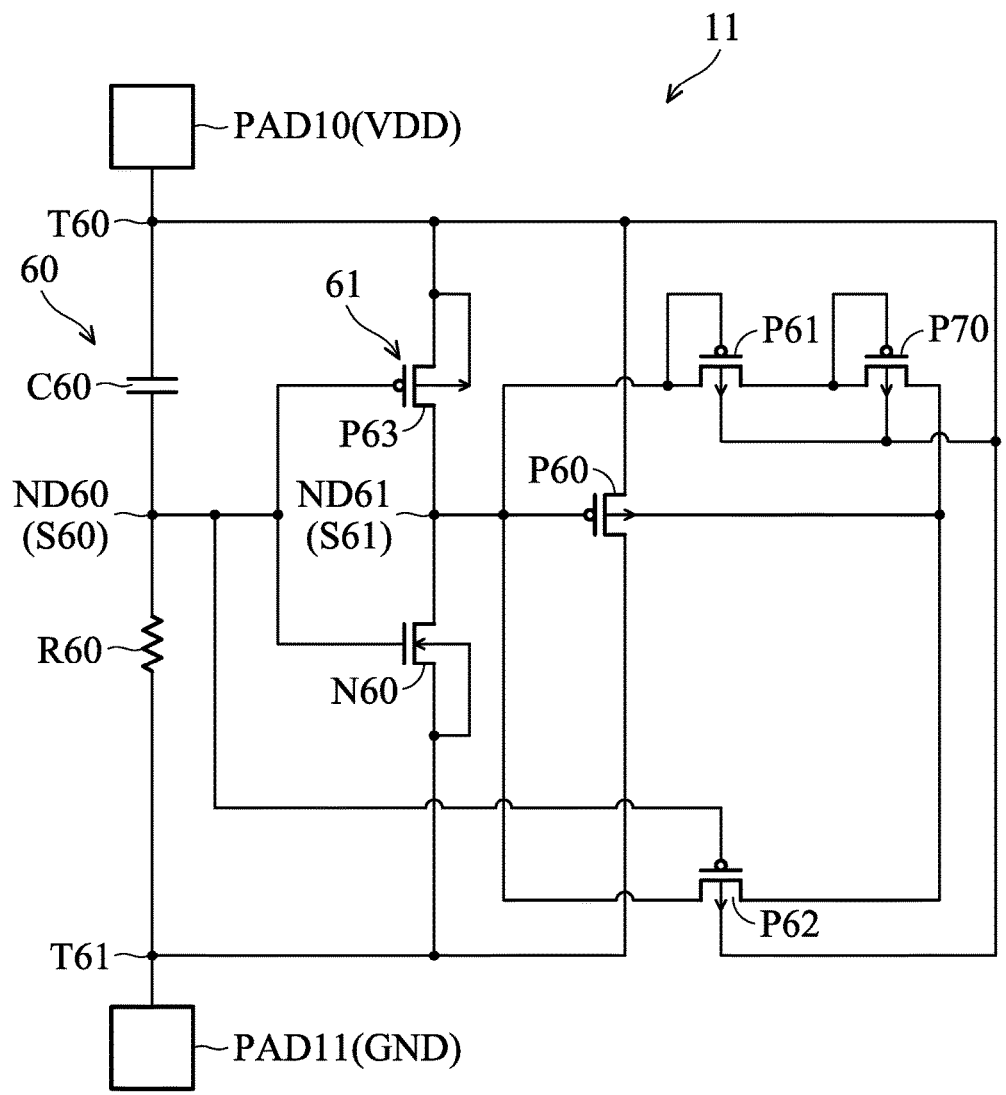
FIG. 7 shows another exemplary embodiment of an ESD protection circuit with an electrostatic discharge path by using P-type transistors.

In an embodiment, the speed of turning on the PMOS transistor P60 can be increased by raising the gate-bulk voltage of the PMOS transistor P60. Thus, the ESD protection circuit 11 may further comprise at least one PMOS transistor which is coupled to the PMOS transistor P61 in series. Referring to FIG. 7, the ESD protection circuit 11 further comprises a PMOS transistor P70. The gate and source of the PMOS transistor P70 are coupled to the drain of the PMOS transistor P61, and the drain thereof is coupled to the bulk of the PMOS transistor P60. The bulk of the PMOS transistor P70 is coupled to the power terminal T60. In the structure of FIG. 7, the source of the PMOS transistor P61 is coupled to the bulk of the PMOS transistor P60 through the PMOS transistor P70. In FIGS. 6 and 7, the elements with the same reference signs perform the same operation, thus, the related operations are omitted. In the embodiment, when the core circuit 10 does not operate in the normal operation mode and an ESD event occurs at the pad PAD10, both the PMOS transistors P61 and P70 are turned on. At this time, the voltage difference between the gate of the PMOS transistor P61 and the drain of the PMOS transistor P70 is two times the value of $V_{TH}$. As described above, the gates of the PMOS transistors P60 and P61 are coupled together through the node ND61, and the drain of the PMOS transistor P70 is coupled to the bulk of the PMOS transistor P60. In other words, there are two PMOS transistors P61 and P70 coupled between the gate and bulk of the PMOS transistor P60. Thus, the gate-bulk voltage $V_{GB}$ (=$2V_{TH}$) of the PMOS transistor P60 in FIG. 7 is larger than the gate-bulk voltage $V_{GB}$ (=$V_{TH}$) of the PMOS transistor P60 in FIG. 6. Compared with the embodiment of FIG. 6, the PMOS transistor P60 in FIG. 7 can be turned on more quickly when an ESD event occurs at the pad PAD10: that is, the PMOS transistor P60 in FIG. 7 can provide a discharge path in a short time.

In the embodiment of FIG. 7, one PMOS transistor which is coupled to the PMOS transistor P61 in series is given as an example for illustration. However, in other embodiments, the number of PMOS transistors coupled to the PMOS transistor P61 in series can be determined according to the system requirements. The higher the number of PMOS transistors coupled to the PMOS transistor P61 in series is, the more the gate-bulk voltage $V_{GB}$ of the PMOS transistor P60 is, so that the PMOS transistor P60 can be turned on more quickly when an ESD event occurs at the pad PAD10.

Figure 8:
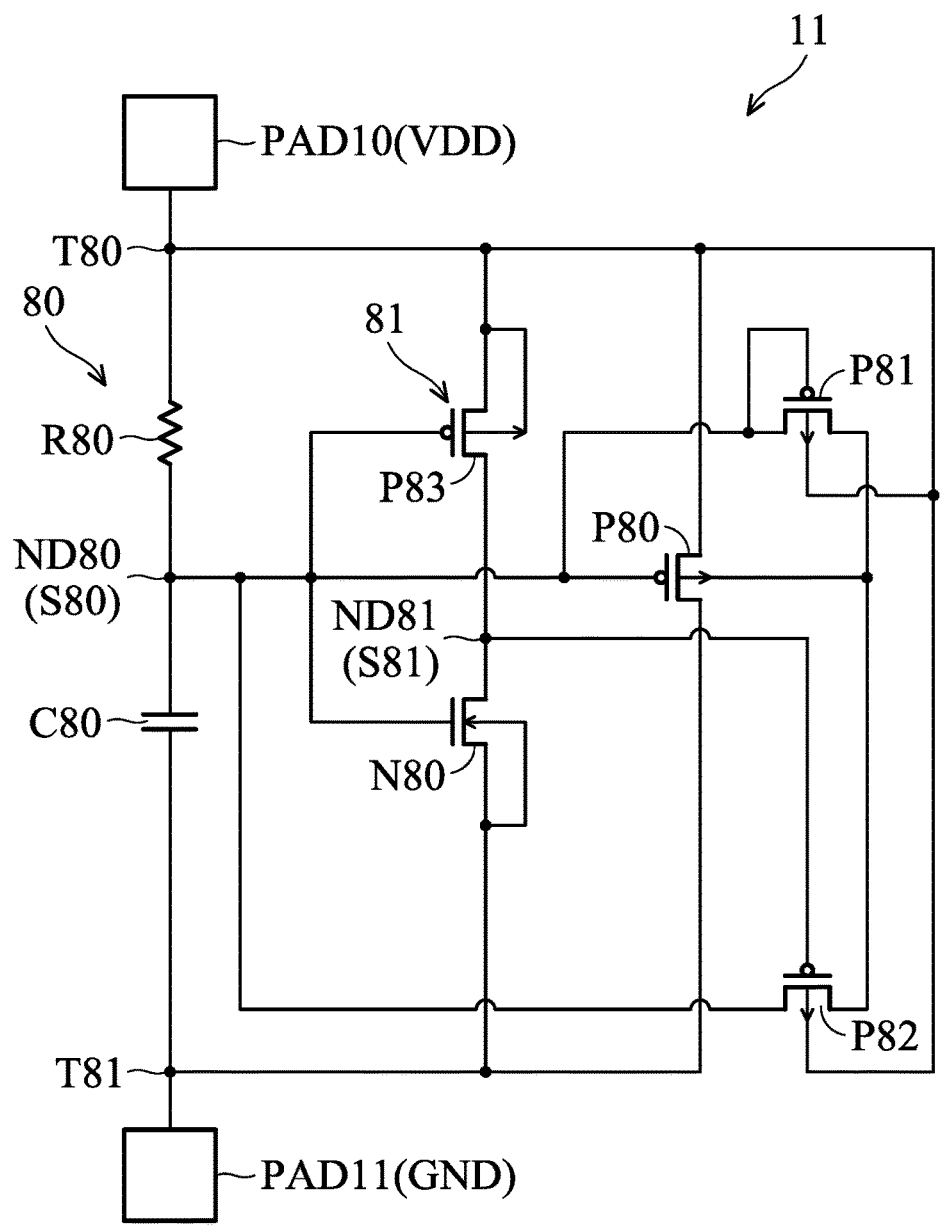
FIG. 8 shows another exemplary embodiment of an ESD protection circuit with an electrostatic discharge path by using P-type transistors.

FIG. 8 shows another exemplary embodiment of the ESD protection circuit. In order to illustrate the circuit structure of the ESD protection circuit 11, FIG. 8 only shows the ESD protection circuit 11 and the pads PAD10 and PAD11. Referring to FIG. 8, the ESD protection circuit 11 comprises an ESD detection circuit 80, an inverter 81, PMOS transistors P80-P82, a power terminal T80, and a ground terminal T81. The power terminal T80 is coupled to the pad PAD10, and the ground terminal T81 is coupled to the pad PAD11. The ESD detection circuit 80 comprises a resistor R80 and a capacitor C80 which are coupled in series. The resistor R80 is coupled between the power terminal T80 and a common node ND80. The capacitor C80 is coupled between the common node ND80 and the ground T81. A signal S80 is generated at the common node ND80. The inverter 81 is coupled to the common node ND80 to receive the signal S80. The inverter 81 inverts the signal S80 to generate a signal S81 at the node ND81. The inverter 81 comprises a PMOS transistor P83 and an NMOS transistor N80. The gate (control electrode terminal) of the PMOS transistor P83 is coupled to the common node ND80, the source (electrode terminal) thereof is coupled to the power terminal T80, and the drain (electrode terminal) thereof is coupled to the node ND81. The bulk and the source of the PMOS transistor P83 are coupled together. The gate of the NMOS transistor N80 is coupled to the common node ND80, the drain thereof is coupled to the node ND81, and the source thereof is coupled to the ground terminal T81. The bulk and the source of the NMOS transistor N80 are coupled together. The gate of the PMOS transistor P80 is coupled to the node ND80 to receive the signal S80, the source thereof is coupled to the power terminal T80, and the drain thereof is coupled to the ground terminal T81. The gate and the source of the PMOS transistor P81 are coupled together at the node ND80, and the drain thereof is coupled to the bulk of the PMOS transistor P80. The bulk of the PMOS transistor P81 is coupled to the power terminal T80. The gate of the PMOS transistor P82 is coupled to the node ND81 to receive the signal S81, the source thereof is coupled to the node ND80 to receive the signal S80, and the drain thereof is coupled to the bulk of the PMOS transistor P80. The bulk of the PMOS transistor P82 is coupled to the power terminal T80.

When the core circuit 10 operates in the normal operation mode, an operation voltage VDD is applied to the pad PAD10, and the pad PAD11 is coupled to the ground (such as 0V). At this time, the signal S80 at the node ND80 is at a high voltage level: that is, there is a high voltage at the node ND80, to turn off the PMOS transistors P80 and P81. The inverter 81 inverts the signal S80 with the high voltage level to generate the signal S81 with a low voltage level. In detail, the high voltage at the node ND80 turns off the PMOS transistor P83 and turns on the NMOS transistor N80. Thus, the signal S81 at the node ND81 is at the low voltage level: that is, there is a low voltage at the node ND81, to turn on the PMOS transistor P82. Through the turned-on PMOS transistor P82, the bulk of the PMOS transistor P80 is pulled to the high level of the node ND80. Accordingly, both the gate and the bulk of the PMOS transistor P80 are at the same high voltage level. Thus, during the period when the core circuit 10 operates normally, the PMOS transistor P80 can be in a stable turned-off state, so that there is no discharge path between the pads PAD10 and PAD11 in the ESD protection circuit 11, and the operation of the core circuit 10 cannot be affected by any unexpected discharge path in the ESD protection circuit 11.

When the core circuit 10 does not operate in the normal operation mode, the operation voltage VDD is not applied to the pad PAD10. When an ESD event occurs at the pad PAD10, the voltage at the power terminal T80 rises immediately. At this time, based on the element characteristics of the capacitor C80, the signal S80 at the node ND80 is at a low voltage level (that is, there is a low voltage at the node ND80) to turn on the PMOS transistors P80 and P81. The inverter 81 inverts the signal S80 with the low voltage level to generate the signal S81 with a high voltage level. In detail, the low voltage at the node ND80 turns off the NMOS transistor N80 and turns on the PMOS transistor P83. Thus, the signal S81 at the node ND81 is at the high voltage level: that is, there is a high voltage at the node ND81, to turn off the PMOS transistor P82. Due to the turned-on PMOS transistor P81, there is a voltage difference between the gate and drain of the PMOS transistor P81 (the voltage difference is $V_{TH}$, $V_{TH}$ is the threshold voltage of the PMOS transistor P81). As described above, the gates of the PMOS transistors P80 and P81 are coupled together through the node ND80, and the drain of the PMOS transistor P81 is coupled to the bulk of the PMOS transistor P80. In other words, the PMOS transistor P81 is coupled between the gate and bulk of the PMOS transistor P80. Thus, there is a voltage difference between the gate and bulk of the PMOS transistor P80, so the gate-bulk voltage $V_{GB}$ is not equal to zero, which ensures that the PMOS transistor P80 is turned on. Due to the turned-on PMOS transistor P80, a discharge path is formed between the power terminal T80 and the ground terminal T81 (that is, between the pads PAD10 and PAD11). Accordingly, the electrostatic charges at the pad PAD10 can be conducted to the pad PAD11 through the discharge path, thereby protecting the elements in the core circuit 10 from being damaged by the electrostatic charges.

Figure 9:
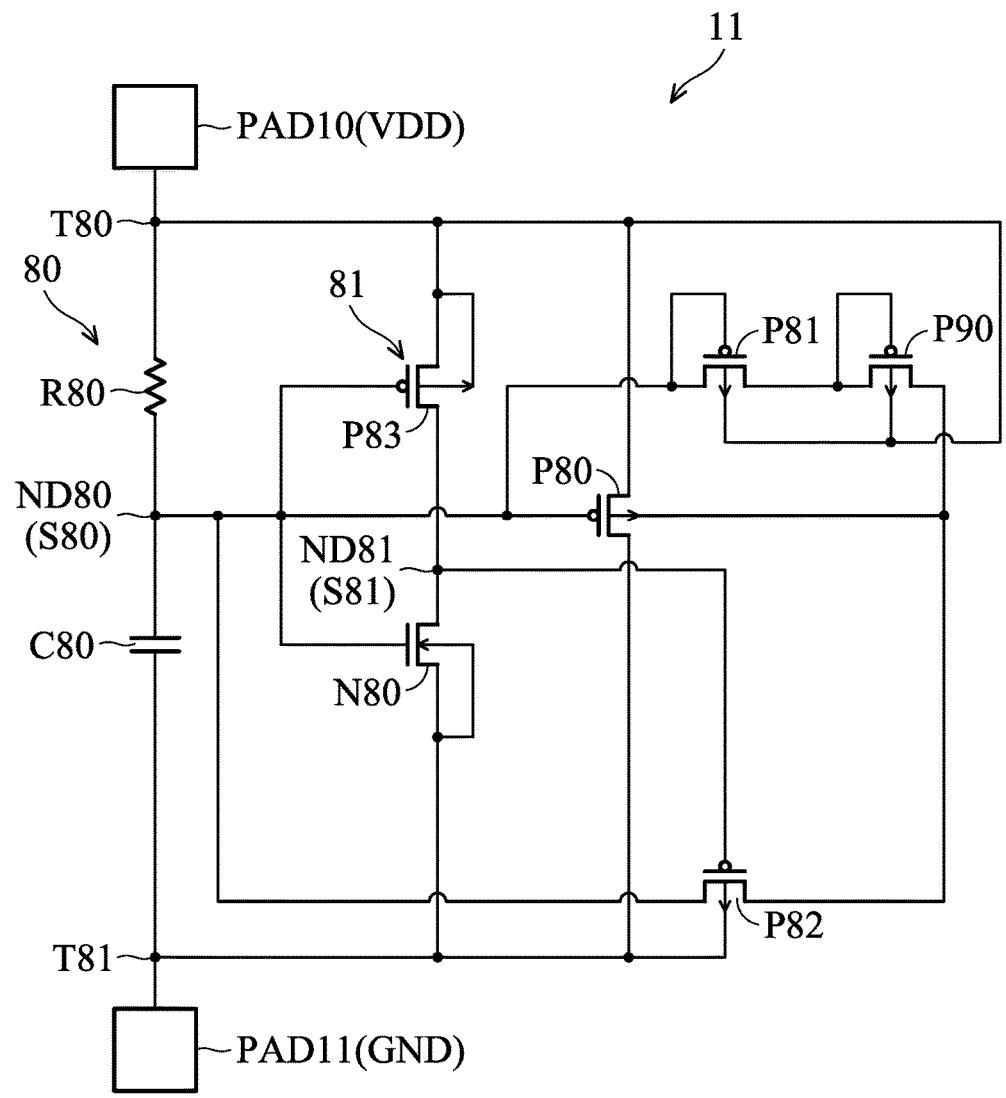
FIG. 9 shows another exemplary embodiment of an ESD protection circuit with an electrostatic discharge path by using P-type transistors.

In an embodiment, the speed of turning on the PMOS transistor P80 can be increased by raising the gate-bulk voltage of the PMOS transistor P80. Thus, the ESD protection circuit 11 may further comprise at least one PMOS transistor which is coupled to the PMOS transistor P81 in series. Referring to FIG. 9, the ESD protection circuit 11 further comprises a PMOS transistor P90. The gate and source of the PMOS transistor P90 are coupled to the drain of the PMOS transistor P81, and the drain thereof is coupled to the bulk of the PMOS transistor P80. The bulk of the PMOS transistor P90 is coupled to the power terminal T80. In the structure of FIG. 9, the source of the PMOS transistor P81 is coupled to the bulk of the PMOS transistor P80 through the PMOS transistor P90. In FIGS. 8 and 9, the elements with the same reference signs perform the same operation, thus, the related operations are omitted. In the embodiment, when the core circuit 10 does not operate in the normal operation mode and an ESD event occurs at the pad PAD10, both the PMOS transistors P81 and P90 are turned on. At this time, the gate-bulk voltage $V_{GB}$ of the PMOS transistor P80 in FIG. 9 is two times the value of $V_{TH}$, which is larger than the gate-bulk voltage $V_{GB}$ ($=V_{TH}$) of the PMOS transistor P80 in FIG. 8. Compared with the embodiment of FIG. 8, the PMOS transistor P80 in FIG. 9 can be turned on more quickly when an ESD event occurs at the pad PAD10: that is, the PMOS transistor P80 in FIG. 9 can provide a discharge path in a short time.

In the embodiment of FIG. 9, one PMOS transistor which is coupled to the PMOS transistor P81 in series is given as an example for illustration. However, in other embodiments, the number of PMOS transistors coupled to the PMOS transistor P81 in series can be determined according to the system requirements. The higher the number of PMOS transistors coupled to the PMOS transistor P81 in series is, the more the gate-bulk voltage $V_{GB}$ of the PMOS transistor P80 is, so that the PMOS transistor P80 can be turned on more quickly when an ESD event occurs at the pad PAD10.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection circuit comprising:
   a first metal-oxide-semiconductor (MOS) transistor, coupled between a power terminal and a ground terminal, having a control electrode terminal coupled to a first node to receive a first signal;
   a second MOS transistor having a control electrode terminal and a first electrode terminal both coupled to the first node and a second electrode terminal coupled to a bulk of the first MOS transistor; and
   a third MOS transistor having a control electrode terminal coupled to a second node to receive a second signal, a first electrode terminal coupled to the first node, and a second electrode terminal coupled to the bulk of the first MOS transistor, wherein the first signal is inverse to the second signal.

2. The electrostatic discharge protection circuit as claimed in claim 1, further comprising:
   a fourth transistor, coupled between the second electrode terminal of the second MOS transistor and the bulk of the first MOS transistor, having a control electrode terminal coupled to the second electrode terminal of the second MOS transistor.

3. The electrostatic discharge protection circuit as claimed in claim 1 further comprising:
   a resistor and a capacitor coupled in series between the power terminal and the ground terminal, wherein the second node is between the resistor and the capacitor, and the second signal is generated at the second node; and
   an inverter receiving the second signal and inverting the second signal to generate the first signal.

4. The electrostatic discharge protection circuit as claimed in claim 3,
   wherein the first MOS transistor, the second MOS transistor, and the third MOS transistor are N-type MOS transistors, and
   wherein the resistor is coupled between the power terminal and the second node, and the capacitor is coupled between the second node and the ground terminal.

5. The electrostatic discharge protection circuit as claimed in claim 3,
   wherein the first MOS transistor, the second MOS transistor, and the third MOS transistor are P-type MOS transistors, and
   wherein the capacitor is coupled between the power terminal and the second node, and the resistor is coupled between the second node and the ground terminal.

6. The electrostatic discharge protection circuit as claimed in claim 3, further comprising:
   a fourth transistor, coupled between the second electrode terminal of the second MOS transistor and the bulk of the first MOS transistor, having a control electrode terminal coupled to the second electrode terminal of the second MOS transistor.

7. The electrostatic discharge protection circuit as claimed in claim 1 further comprising:
   a resistor and a capacitor coupled in series between the power terminal and the ground terminal, wherein the first node is between the resistor and the capacitor, and the first signal is generated at the first node; and
   an inverter receiving the first signal and inverting the first signal to generate the second signal.

8. The electrostatic discharge protection circuit as claimed in claim 7,
   wherein the first MOS transistor, the second MOS transistor, and the third MOS transistor are N-type MOS transistors, and
   wherein the capacitor is coupled between the power terminal and the first node, and the resistor is coupled between the first node and the ground terminal.

9. The electrostatic discharge protection circuit as claimed in claim 7,
   wherein the first MOS transistor, the second MOS transistor, and the third MOS transistor are P-type MOS transistors, and
   wherein the resistor is coupled between the power terminal and the first node, and the capacitor is coupled between the first node and the ground terminal.

10. The electrostatic discharge protection circuit as claimed in claim 7, further comprising:
    a fourth transistor, coupled between the second electrode terminal of the second MOS transistor and the bulk of the first MOS transistor, having a control electrode terminal coupled to the second electrode terminal of the second MOS transistor.

11. An integrated circuit comprising:
    a core circuit coupled between a first pad and a second pad; and
    an electrostatic discharge protection circuit coupled to the first pad, wherein when an electrostatic discharge event occurs at the first pad, the electrostatic discharge protection circuit provides a discharge path between the first pad and the second pad to protect the core circuit, wherein the electrostatic discharge protection circuit comprises:

a first metal-oxide-semiconductor (MOS) transistor, coupled between the power terminal and the ground terminal, having a control electrode terminal coupled to a first node to receive a first signal;

a second MOS transistor having a control electrode terminal and a first electrode terminal both coupled to the first node and a second electrode terminal coupled to a bulk of the first MOS transistor; and a third MOS transistor having a control electrode terminal coupled to a second node to receive a second signal, a first electrode terminal coupled to the first node, and a second electrode terminal coupled to the bulk of the first MOS transistor, wherein the first signal is inverse to the second signal.

12. The integrated circuit as claimed in claim 11, further comprising:

a fourth transistor, coupled between the second electrode terminal of the second MOS transistor and the bulk of the first MOS transistor, having a control electrode terminal coupled to the second electrode terminal of the second MOS transistor.

13. The integrated circuit as claimed in claim 11 further comprising:

a resistor and a capacitor coupled in series between the power terminal and the ground terminal, wherein the second node is between the resistor and the capacitor, and the second signal is generated at the second node; and an inverter receiving the second signal and inverting the second signal to generate the first signal.

14. The integrated circuit as claimed in claim 13, wherein the first MOS transistor, the second MOS transistor, and the third MOS transistor are N-type MOS transistors, and wherein the resistor is coupled between the power terminal and the second node, and the capacitor is coupled between the second node and the ground terminal.

15. The integrated circuit as claimed in claim 13, wherein the first MOS transistor, the second MOS transistor, and the third MOS transistor are P-type MOS transistors, and wherein the capacitor is coupled between the power terminal and the second node, and the resistor is coupled between the second node and the ground terminal.

16. The integrated circuit as claimed in claim 13, further comprising:

a fourth transistor, coupled between the second electrode terminal of the second MOS transistor and the bulk of the first MOS transistor, having a control electrode terminal coupled to the second electrode terminal of the second MOS transistor.

17. The integrated circuit as claimed in claim 11 further comprising:

a resistor and a capacitor coupled in series between the power terminal and the ground terminal, wherein the first node is between the resistor and the capacitor, and the first signal is generated at the first node; and an inverter receiving the first signal and inverting the first signal to generate the second signal.

18. The integrated circuit as claimed in claim 17, wherein the first MOS transistor, the second MOS transistor, and the third MOS transistor are N-type MOS transistors, and wherein the capacitor is coupled between the power terminal and the first node, and the resistor is coupled between the first node and the ground terminal.

19. The integrated circuit as claimed in claim 17, wherein the first MOS transistor, the second MOS transistor, and the third MOS transistor are P-type MOS transistors, and wherein the resistor is coupled between the power terminal and the first node, and the capacitor is coupled between the first node and the ground terminal.

20. The integrated circuit as claimed in claim 17, further comprising:

a fourth transistor, coupled between the second electrode terminal of the second MOS transistor and the bulk of the first MOS transistor, having a control electrode terminal coupled to the second electrode terminal of the second MOS transistor.

* * * * *